United States Patent
Fedigan

(10) Patent No.: US 10,415,965 B2
(45) Date of Patent: Sep. 17, 2019

(54) METHOD AND APPARATUS FOR TILT SENSING USING ECCENTRIC MOTOR

(71) Applicant: Texas Instruments Incorporated, Dallas, TX (US)

(72) Inventor: Stephen John Fedigan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 738 days.

(21) Appl. No.: 14/505,543

(22) Filed: Oct. 3, 2014

(65) Prior Publication Data

US 2016/0097638 A1    Apr. 7, 2016

(51) Int. Cl.
*G01C 9/06* (2006.01)
*G01R 19/00* (2006.01)

(52) U.S. Cl.
CPC ............ *G01C 9/06* (2013.01); *G01R 19/0092* (2013.01)

(58) Field of Classification Search
CPC ............................. G01C 9/06; G01R 19/0092
USPC ............ 318/568.16, 568.11, 568.1, 567, 560
See application file for complete search history.

(56) References Cited

U.S. PATENT DOCUMENTS

| | | | |
|---|---|---|---|
| 4,549,277 A * | 10/1985 | Brunson | G01C 9/06 33/366.12 |
| 5,684,456 A | 11/1997 | Walter | |
| 5,777,290 A | 7/1998 | Tzanev | |
| 5,937,528 A * | 8/1999 | Shijo | G01C 9/06 33/366.21 |
| 6,831,750 B2 | 12/2004 | Mehrl et al. | |
| 7,977,910 B2 * | 7/2011 | Osman | H02P 1/50 318/268 |
| 8,686,839 B2 | 4/2014 | Posamentier | |
| 2002/0001211 A1 * | 1/2002 | Huggett | H02M 1/15 363/124 |
| 2002/0162235 A1 | 11/2002 | Rando | |
| 2005/0218853 A1 * | 10/2005 | Kokami | G05B 11/28 318/599 |
| 2006/0140089 A1 * | 6/2006 | Yonezawa | G11B 7/0956 369/47.32 |
| 2006/0227688 A1 * | 10/2006 | Okamatsu | G11B 7/0956 369/53.19 |

(Continued)

FOREIGN PATENT DOCUMENTS

| | | |
|---|---|---|
| CN | 103458758 A | 12/2013 |
| CN | 103837708 A | 6/2014 |

(Continued)

OTHER PUBLICATIONS

International Search Report with Written Opinion for PCT/US2015/054057 dated Feb. 4, 2016.

(Continued)

*Primary Examiner* — Kawing Chan
(74) *Attorney, Agent, or Firm* — Lawrence J. Bassuk; Charles A. Brill; Frank D. Cimino

(57) ABSTRACT

Systems, apparatus and methods are presented for sensing or estimating a tilt angle, in which a current flowing in an eccentric mass motor is sensed, and a detector circuit assesses the amplitude of a synchronous component of the motor current and provides an output signal or value indicating a tilt angle relative to a gravitational axis at least partially according to the amplitude of the synchronous component of the motor current.

6 Claims, 13 Drawing Sheets

(56) References Cited

U.S. PATENT DOCUMENTS

| | | | |
|---|---|---|---|
| 2008/0030155 A1* | 2/2008 | Patel | B60K 6/26 318/400.02 |
| 2010/0002552 A1* | 1/2010 | Shiozawa | G11B 7/0956 369/47.15 |
| 2010/0116562 A1 | 5/2010 | Cruz-Hernandez et al. | |
| 2011/0179871 A1* | 7/2011 | Misawa | G01P 15/125 73/514.32 |
| 2011/0282529 A1* | 11/2011 | Song | B60L 15/20 701/22 |
| 2012/0173106 A1* | 7/2012 | Takenaka | B62K 1/00 701/70 |
| 2013/0267775 A1* | 10/2013 | Okamoto | A61B 1/0052 600/109 |
| 2013/0287602 A1* | 10/2013 | Suzuki | F04B 17/03 417/410.1 |
| 2014/0016758 A1* | 1/2014 | Theiss | A61B 6/035 378/197 |
| 2014/0115759 A1* | 5/2014 | Tomlin | A63B 71/10 2/411 |
| 2014/0118126 A1 | 5/2014 | Garg et al. | |

FOREIGN PATENT DOCUMENTS

| | | |
|---|---|---|
| RU | 2252313 C2 | 5/2005 |
| SU | 1008431 A1 | 3/1983 |
| SU | 1432332 A1 | 10/1988 |

OTHER PUBLICATIONS

Precision Microdrives Product Data Sheet, Pico Vibe, 3mm Vibration Motor—8mm Type, Model 303-100, 2014 Precision Microdrives Limited, pp. 1-4.
Haptics Solutions for ERM and LRA Actuators, Texas Instruments, TI.com/touch, 2013, 5 pgs.
Texas Instruments, DRV2604, Haptic Driver for ERM and LRA With Internal Memory and Smart Loop Architecture, SLOS824—Dec. 2012, 6 pgs.
European Search Report for Application No. EP 15846811.6 dated May 8, 2018.
China Search Report of Feb. 2, 2019.

\* cited by examiner

METHOD AND APPARATUS FOR TILT SENSING USING ECCENTRIC MOTOR

BACKGROUND

Various types of instruments are required to be maintained at a specific position relative to a reference plane. Some devices provide certain features or functions based on a tilt angle of the device enclosure, such as smart phones and tablet computers with displays performing auto rotation between landscape and portrait views as the device itself is rotated or tilted by a user. Smart phones, gaming controllers, and many radio-controlled vehicles have tilt sensors to measure the orientation of the body with respect to a vertical or horizontal plane. The correct operation of these instruments often depends on the ability to identify a desired position or maintain a desired position relative to the reference plane. Additionally, tilt angle sensors are often used in electronic devices, industrial production and scientific research work. These sensors are useful for measuring the inclination of a system relative to a reference plane. In order to detect the tilt angle of a desired object, acceleration sensors, such as an accelerometer, detect the acceleration of the object. For example, an acceleration sensor detects a tilt angle and provides a signal that identifies whether or not a camera, phone, tablet or other electronic device is being placed horizontally or vertically at the time of use. Additionally, tilt angle sensors have been used to detect the tilt of a vehicle or electronic device and to determine whether shifting, falling, or tilting of the vehicle or electronic device is occurring. Tilt angle sensors include accelerometers, magnetic devices, pendulum systems and/or spring elements. However, these sensors suffer from high cost, poor accuracy and/or large size and may be unsuitable for certain end uses. These sensors can be expensive and consume valuable space on a circuit board of the host system.

SUMMARY

Systems, apparatus and methods are presented for sensing or estimating a tilt angle, in which a current flowing in an eccentric mass motor is sensed, and a detector circuit assesses the amplitude of a synchronous component of the motor current and provides an output signal or value indicating a tilt angle relative to a gravitational axis at least partially according to the amplitude of the synchronous component of the motor current.

DETAILED DESCRIPTION

Figure 1:
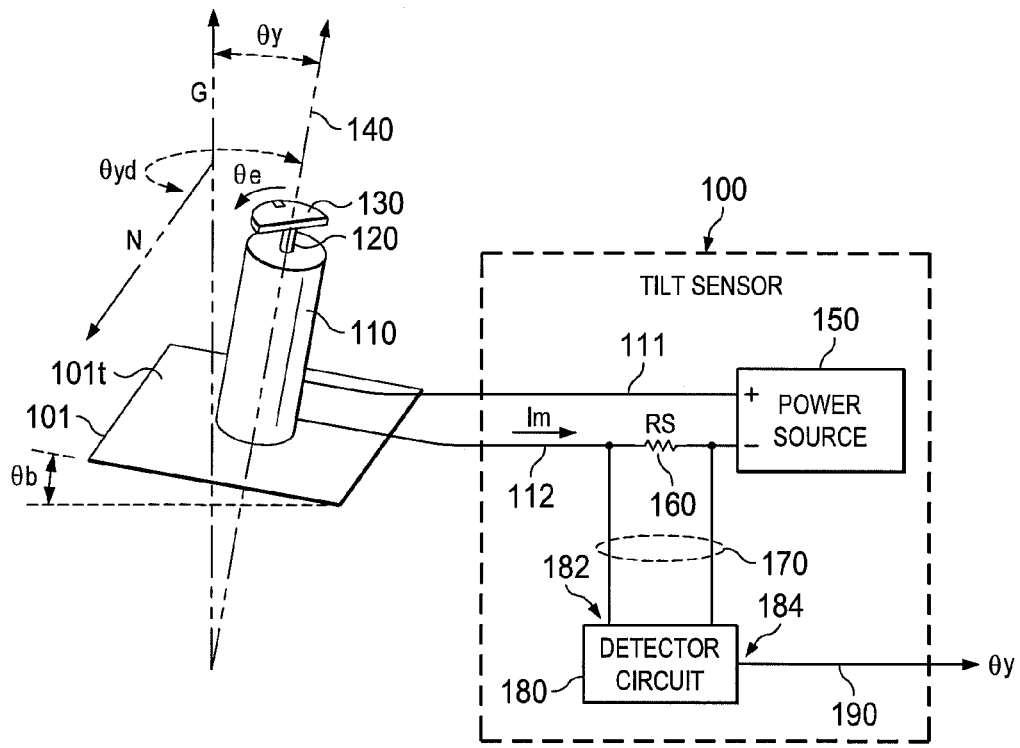
FIG. 1 is a system diagram of a tilt sensor apparatus for sensing a tilt angle of an associated motor having an eccentric mass supported by a rotor relative to a gravitational axis based at least partially on a synchronous component of the motor current.

One or more embodiments or implementations are hereinafter described in conjunction with the drawings, wherein like reference numerals are used to refer to like elements throughout, and wherein the various features are not necessarily drawn to scale.

Tilt sensor or estimation apparatus is provided in accordance with one or more aspects of the disclosure, including a sensor for sensing a current of a motor or other actuator having a rotor that supports a rotating eccentric mass. The sensor provides a sensor output signal representing the motor current to a detector circuit which provides a tilt angle output signal or value representing the tilt angle of the rotor axis relative to a gravitational (e.g., vertical) axis based at least partially on the amplitude of the synchronous component of the motor current.

In certain embodiments, the detector circuit includes a synchronous demodulator for demodulating the sensor output signal to provide an output signal representing the amplitude of the speed synchronous component of the current, as well as a second circuit providing the tilt angle output signal or value. A processor is provided in certain implementations to receive quadrature demodulator output signals and to compute an amplitude value representing the absolute value of the synchronous component and to provide a tilt angle output signal or value based on the computed amplitude. In certain embodiments, moreover, the processor may compute a motor current angle value according to the demodulator outputs, and may provide the tilt angle output signal or value based at least partially on the computed motor current angle value and the computed amplitude value. A second sensor is included in certain embodiments for providing a signal to the detector circuit representing rotation of the rotor. In various implementations, a phase locked loop (PLL) or other suitable circuit may determine the frequency of the synchronous component. A filter circuit, such as a bandpass filter or a high pass filter may be employed in certain embodiments for removing low frequency components of the sensor output signal.

In other embodiments, the detector circuit includes an integrator circuit with an amplifier providing the tilt angle output signal or value, and certain implementations include a filter circuit for removing low frequency components of the sensor output signal to provide the input to the integrator circuit.

In certain embodiments, the detector circuit includes a filter circuit for removing low frequency components of the sensor output signal, and a rectifier circuit for rectifying the filtered signal to provide the tilt angle output signal or value.

The detector circuit in certain embodiments includes a peak detector circuit for providing the tilt angle output signal or value according to detected peaks of the sensor output signal. A filter circuit may be provided in certain implementations for removing low frequency components of the sensor output signal, which provides a filtered signal to an input of the peak detector circuit. In certain implementations, a phase detector circuit is provided for detecting a motor current angle, which provides a phase signal representing the motor current angle, and a processor is employed to compute a digital tilt angle output value based at least partially on the tilt angle output signal from the peak detector circuit and the phase signal from the phase detector circuit.

In certain embodiments the second sensor is included for providing a signal representing rotation of the rotor, and a phase detector circuit is provided for detecting a rotational angle of the rotor axis relative to a fixed direction and providing a tilt direction signal or value representing a direction of rotor axis tilting relative to the fixed direction based at least partially on the position signal from the second sensor and the synchronous component of the motor current.

A system is provided in accordance with further aspects of the disclosure, including at least one motor mounted in a fixed position relative to a base and including a rotor defining a rotor axis extending at a predetermined angle relative to a plane of the base, with an eccentric mass supported by the rotor. The system further includes a power source for providing a motor current to cause the rotor to rotate, along with a tilt sensor apparatus having a sensor and a detector circuit. The sensor is operative to provide a sensor output signal representing the motor current, and the detector circuit provides a tilt angle output signal or value representing an angle of the rotor axis relative to a gravitational axis based at least partially on the amplitude of a synchronous component of the motor current. In certain embodiments, two or more eccentric mass motors and associated detector circuits are provided, with the motor housings mounted in fixed positions relative to the plane of the base with the first and second rotor axes extending at a predetermined non-zero angle relative to one another. A circuit is provided to receive first and second tilt angle output signals or values from the detector circuits, and to provide a tilt angle output representing a base tilt angle of the plane of the base relative to the gravitational axis based at least partially on the first and second tilt angle output signals or values from the detector circuits.

A method is provided for estimating the tilt angle of a structure relative to a gravitational axis according to further aspects of the disclosure. The method includes providing an actuator having an eccentric mass adapted to rotate about a rotor axis (e.g., an eccentric mass motor) in a fixed position on the structure, rotating the eccentric mass about the rotor axis, sensing an actuator current, and estimating the structure tilt angle at least partially according to a synchronous component of the sensed current. In certain embodiments, the tilt angle is estimated by filtering a current sense signal to remove low frequency components and provide a synchronous component signal representing oscillation of the actuator current at a frequency related to the rotational speed of the eccentric mass, as well as determining an amplitude of the synchronous component signal and correlating the amplitude of the synchronous component signal with an estimated tilt angle value.

FIG. 1 shows a system including a tilt sensor apparatus 100 for sensing a tilt angle θy of an associated eccentric mass actuator (e.g., motor) 110 relative to a gravitational (e.g., vertical) axis G. The motor 110 in one embodiment is a DC brush motor including a rotor 120 rotating when powered about a rotor axis 140 and supporting an eccentric mass 130. As shown in FIG. 1, the rotor 120 and the eccentric mass 130 rotate in the example embodiment in a direction indicated by an arrow in FIG. 1 with the eccentric mass 130 positioned at a rotational angle θe. In operation, the motor 110 is driven by a DC current from a power source 150 via motor leads 111 and 112, with the power source 150 in the example embodiment providing a generally fixed DC current Im in order to operate the motor 110 at a generally fixed rotational speed.

The eccentric mass motor 110 includes a housing mounted using any suitable means in a generally fixed position or location relative to a base structure 101 with the rotor axis 140 extending at a predetermined angle (e.g., 180° in this example) relative to the plane of the base 101. In this example, the motor 110 is mounted with the rotor angle 140 generally normal or perpendicular to the plane of the base 101, and the base 101 in this example provides a generally planar top surface 101t defining a plane, although the tilt sensor apparatus 100 of the present disclosure can be employed in association with eccentric mass motors 110 mounted onto any profile surface of a base structure 101. In one non-limiting embodiment, the base 101 is a printed circuit board, although other embodiments are possible. In another example, the eccentric mass motor 110 is mounted on or in a base 101 forming part of an enclosure or housing of a mobile phone, laptop computer, tablet computer, robotic structure, movable machine component, etc.

The eccentric mass motor 110 is used to detect or estimate the tilt angle θy, and may provide further functionality in a host system, such as for providing tactile feedback or other useful functions in a consumer electronic device, etc. In the example embodiment, the power source 150 is controlled in order to provide the motor current Im in generally continuous fashion to allow tilt angle estimation or detection, and the power source 150 and may, but need not, be operated all the time. For example, a host system processor (not shown) may be operatively coupled (e.g., connected directly or indirectly) with the tilt sensor apparatus 100 in order to initiate tactile feedback operation of the power source 150 and hence the eccentric mass motor 110 to implement certain host system functions such as notifications of incoming calls, etc., and may otherwise initiate tilt angle sensing operations from time to time (or continuously) at a predetermined motor current Im and hence a predetermined rotational motor speed. In the example embodiment, the power source 150 is a DC source providing a DC motor current Im, although not a strict requirement of all possible embodiments. In addition, the operation of the eccentric mass motor 110 at non-zero angles θy relative to the gravitational axis G introduces an AC synchronous component on the motor current Im, where the inventor has appreciated that the amplitude of this synchronous current component varies in relation to the angle θy.

The motor current Im is sensed using a sensor 160, in this case a series sense resistor RS coupled between the second motor lead 112 and the negative power source connection to provide a sensor output signal 170 (e.g., a differential voltage signal as shown, or a single ended signal in other embodiments) representing the motor current Im to an input 182 of a detector circuit 180. Other embodiments are possible, for example, using a magnetic current sensor (not shown) or any suitable means for providing a sensor output signal 170 representing the motor current Im. The detector circuit 180 has an output 184 providing a tilt angle output signal or value 190 representing the angle θy of the rotor axis 140 relative to the gravitational axis G based at least in part on the amplitude of a synchronous component of the motor current Im. Various applications are possible for use of the output signal or value 190, including without limitation selective adjustment of display screens for smart phones, tablet computers, etc. and/or for any application including aeronautics, robotics or manufacturing systems in which it is desirable to know a tilt angle θy of a structure including a base 101 relative to the gravitational axis G. The tilt sensor apparatus 100 may be employed for estimating a tilt angle of a structure relative to the gravitational axis G through provision of the motor current Im to rotate the eccentric mass 130 about the rotor axis 140, sensing the current flow Im, and estimating the tilt angle of the structure at least partially according to the synchronous component of the sensed current Im. As further shown in FIG. 1, the direction of the axis 140 in three-dimensional space may be estimated by characterizing both the tilt angle θy representing an angle between the rotor axis 140 and the gravitational axis G, as well as a rotational angle or tilt direction angle θyd indicating an angle between the tilted rotor axis 140 and a horizontal reference, such as true North N shown in FIG. 1. Described further below in connection with FIGS. 11-14, multiple eccentric mass motor systems and corresponding detector circuits 180 can be employed in certain embodiments to ascertain both θy and θyd.

Figure 2:
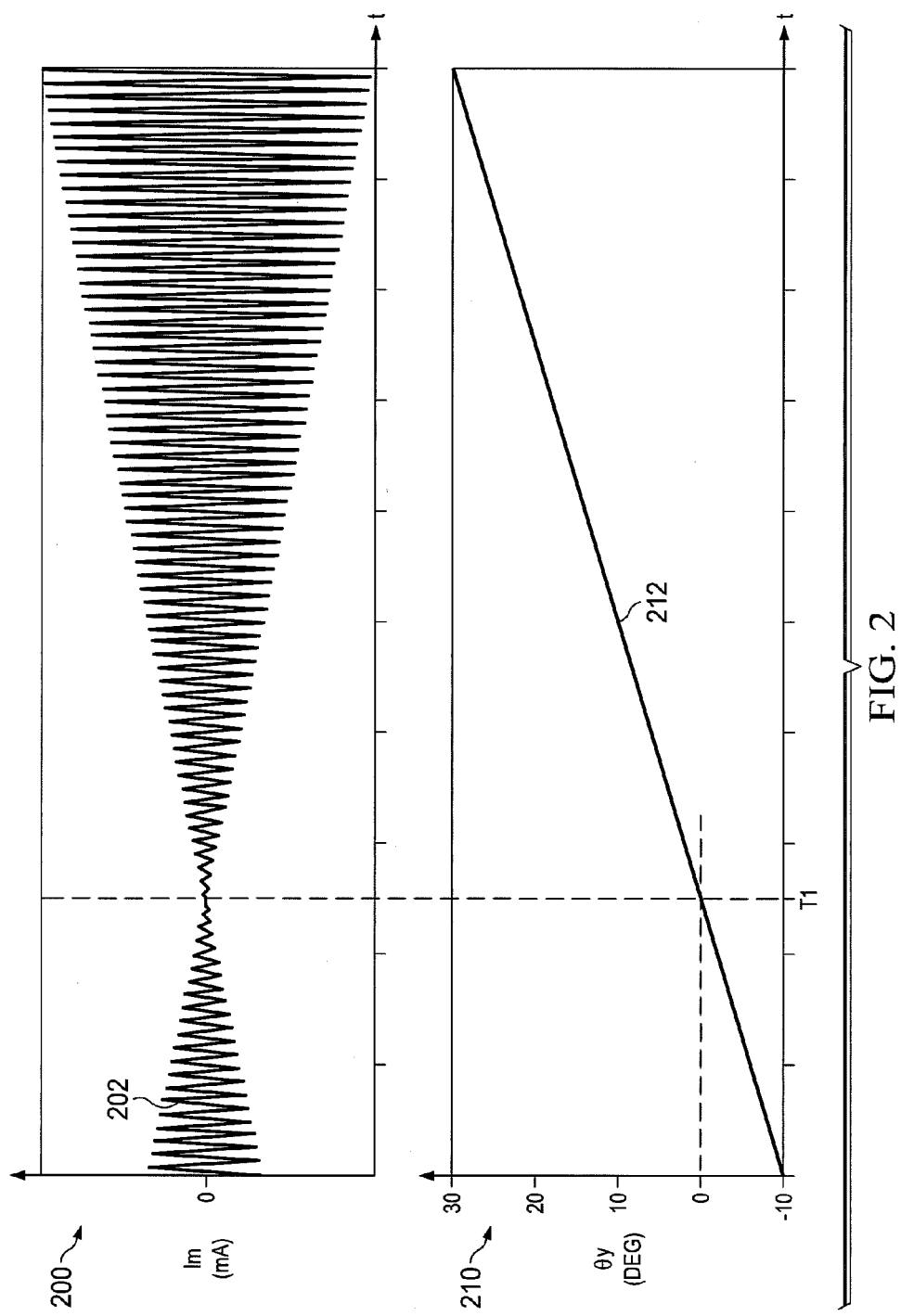
FIG. 2 is a graph of a synchronous component of the motor current and a tilt sensor output signal as a function of time as the associated motor is tilted relative to the gravitational axis.

FIG. 2 provides graphs 200 and 210 respectively showing a synchronous component 202 of the motor current Im and a tilt sensor output signal 212 as a function of time "t" as the eccentric mass motor 110 and its associated rotor axis 140 are gradually tilted relative to the gravitational axis G. As shown in FIG. 2, the synchronous component 202 of the motor current Im in this example is a generally sinusoidal waveform having an envelope or amplitude (e.g., peak to peak amplitude in this case) varying generally in proportion to the tilt angle, where the eccentricity of the mass 130 does not introduce any additional torque load on the motor 110 at 0° tilt angle θy, but non-zero values for the angle θy cause the motor load to undergo sinusoidal increases and decreases in each rotational cycle of the rotor 120. Moreover, the eccentric loading of the motor at non-zero angles θy causes sinusoidal increases and decreases in the motor current Im as shown in the graph 200, which are synchronous to the rotor rotation and hence to the motor speed ω. Furthermore, the inventor has appreciated that increases to the tilt angle θy result in corresponding increases to the peak to peak amplitude of the synchronous component of the motor current Im.

The detector circuit 180 (e.g., FIG. 1) evaluates this sinusoidal or synchronous component 202 of the motor current to provide a tilt angle output as a signal and/or a digital value 190 according to the synchronous component amplitude. Different implementations of the detector circuit 180 are possible, with several non-limiting examples shown and described hereinafter. In this regard, a detector circuit 180 can employ analog circuitry to provide an analog voltage or current signal 190 representing the tilt angle θy based at least in part on the amplitude of a synchronous component of the motor current Im according to the sensor output signal 170. In other embodiments, analog circuitry may be combined with digital circuitry including one or more processors (e.g., microprocessors, microcontrollers, DSPs, programmable logic, etc.) and/or a processor circuit may be employed with suitable analog to digital converter circuitry to directly receive a sensor output signal 170 and perform analysis to generate a tilt angle value 190 representing the tilt angle θy according to programming instructions, and a digital to analog conversion circuit may be employed to generate a resulting analog tilt angle output signal 190 representing the tilt angle θy in certain embodiments. As previously mentioned, the output signal or value 190 may be employed by any suitable system, such as a host processor of an electronic device in which the tilt sensor apparatus 100 and the associated motor 110 are installed.

Figure 3:
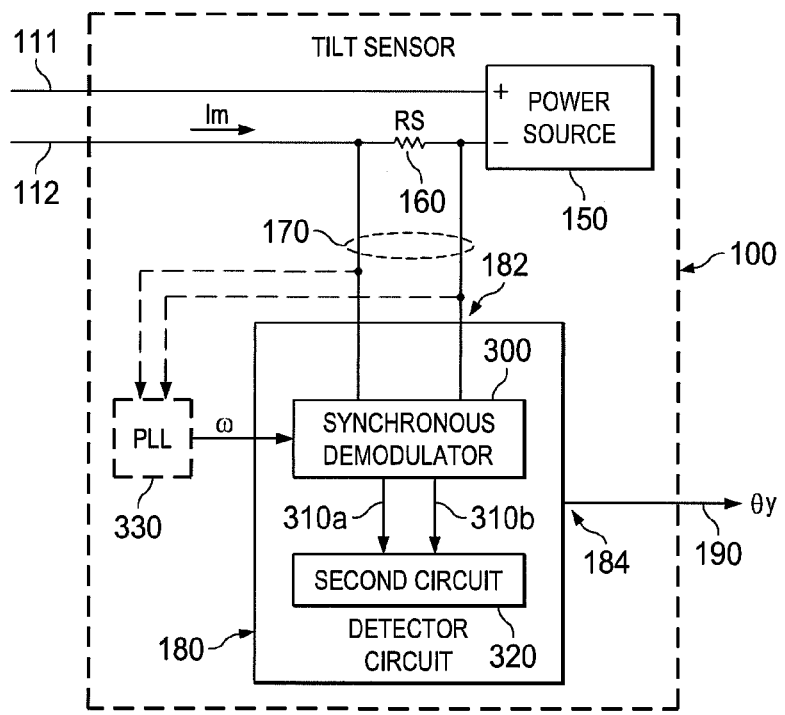
FIG. 3 is a schematic diagram of a tilt sensor apparatus embodiment including a synchronous demodulator for providing an output representing the amplitude of the synchronous component of the motor current and a second circuit for providing a tilt angle output signal based at least partially on the demodulator output signal.

FIG. 3 shows a tilt sensor apparatus embodiment 100 including a synchronous demodulator circuit 300 for providing one or more demodulator outputs 310, for example, quadrature outputs 310a and 310b representing the amplitude of the synchronous component of the motor current Im, as well as a second circuit 320 for providing the tilt angle output signal 190 at the detector circuit output 184 based at least partially on the demodulator output signal or signals 310. In this example, the synchronous demodulator 300 selectively demodulates the sensor output signal 170 to provide the outputs 310a and 310b representing the amplitude and phase of the synchronous component of the motor current Im. In the embodiment of FIG. 3, an input of a phase locked loop PLL 330 is operatively coupled with the detector circuit input 182 to receive the sensor output signal 170, and the PLL 330 operates to determine the frequency ω of the synchronous component of the motor current Im. The PLL 330 in this example has an output providing a signal or value ω representing the frequency of the synchronous component of the motor current Im as an input to the synchronous demodulator 300. Other embodiments are possible in which the synchronous demodulator performs demodulation to generate one or more outputs 310 using a fixed demodulation frequency ω, for example, corresponding to a known operating motor speed of the eccentric motor 110. In addition, further embodiments may employ different frequency sensing circuitry to actively provide a frequency signal or value ω as an input to the synchronous demodulator 300.

Figure 4:
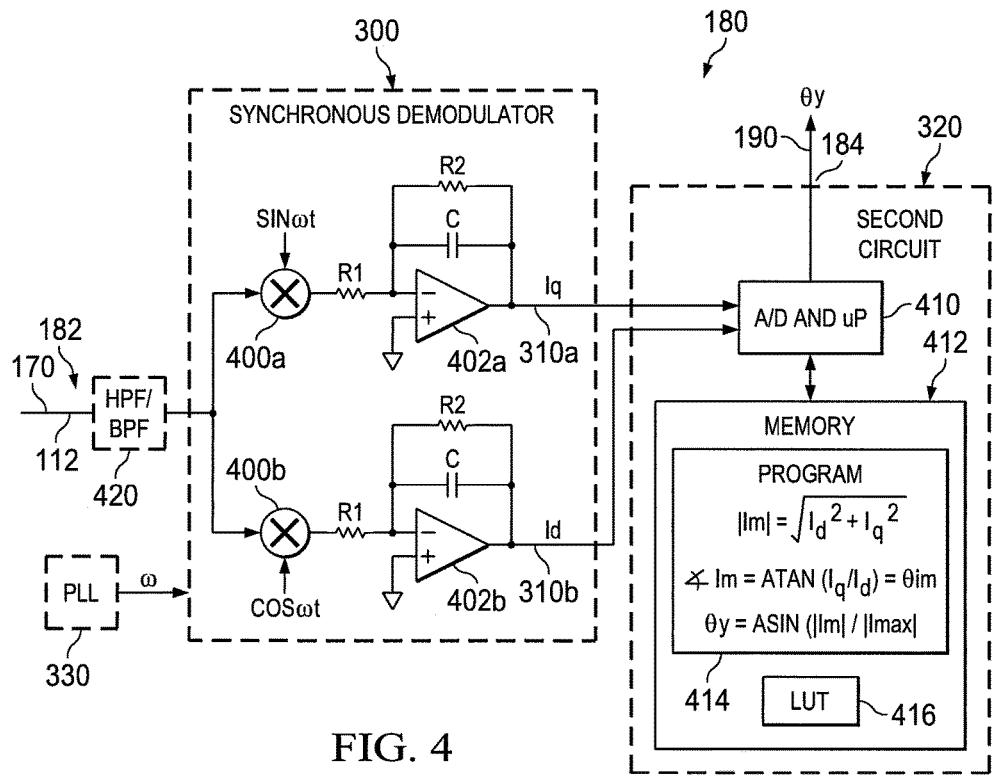
FIG. 4 is a schematic diagram of further details of the synchronous demodulator of FIG. 3 and a processor-implemented second circuit to provide the tilt angle output signal.

FIG. 4 shows further details of an embodiment of the synchronous demodulator 300 of FIG. 3, with a second circuit 320 including a processor 412 for providing a tilt angle output signal or value 190 representing the tilt angle θy. In one possible implementation, the synchronous demodulator circuit 300 directly receives the sensor output signal 170, for example, with an input connected to the return motor lead 112. In another non-limiting embodiment, the detector circuitry 180 includes a filter circuit 420, for example, a high pass filter (HPF) or a bandpass filter (BPF) for removing low frequency components of the sensor output signal 170. In the example of FIG. 4, the filter circuit 420 includes an input coupled with the detector circuit input 182 to receive the sensor output signal 170, as well as an output coupled to provide a filtered output signal based on the sensor output signal 170 to an input of the synchronous demodulator 300. The synchronous demodulator 300 is operative to selectively demodulate the filtered output signal from the filter circuit 420 to provide the demodulator output signals 310a (Iq) and 310b (Id) in quadrature form representing the amplitude and phase of the synchronous component of the motor current Im.

The demodulator circuit 300 in FIG. 4 includes first and second multipliers 400a and 400b each receiving the sensor output signal 170 (e.g., directly or through any provided filter circuit 420), with the first multiplier 400a multiplying the received input signal by a sine function signal SIN ωt, where the frequency ω may be a predetermined frequency (e.g., based on the assumed constant motor speed operation for a constant DC output from the power source 150), or a frequency signal ω may be received from an external circuit, for example, a PLL or other circuit 330 as shown in FIG. 3. The second multiplier 400b multiplies the input signal by a cosine function COS ωt. The outputs of the multipliers are each provided to an amplifier circuit including an input resistor R1 connected from the corresponding multiplier output to an inverting (−) input of a corresponding op amp 402 (e.g., amplifier 402a in a first channel, and amplifier 402b in the second channel in this example). A feedback circuit in each channel includes a capacitor C connected in parallel with a second resistor R2 between the inverting input and an amplifier output terminal and with the amplifier outputs providing the quadrature Iq and direct Id demodulated current signals 310a and 310b, respectively as inputs to the first and second circuit 320.

As further shown in FIG. 4, the second circuit 320 includes a processor circuit 410 with an integral or separate analog to digital (A/D) converter. In one possible implementation, the A/D converter receives the analog quadrature signals 310a and 310b, and converts these to provide corresponding digital values as a series of samples for use by the processor. The second circuit 320 in this example also includes an electronic memory 412 for storage of data and program instructions 414, as well as for storing a lookup table (LUT) 416 for determining an inverse sine (ARCSIN) function. The processor 410 in this example provides a tilt angle output value 190 at the detector circuit output 184 representing the tilt angle θy according to the instructions of the program 414 by any suitable processing technique. In one possible embodiment, the processor program 414 causes the processor 410 to solve the following equations based on the demodulator outputs 310:

$$|Im|=\text{SQRT}(Id^2+Iq^2); \text{ and} \quad (1)$$

$$\text{angle}(Im)=A\ \text{TAN}(Iq/Id)=\theta im \quad (2)$$

$$A\ \text{SIN}(|Im|/|Imax|)=\theta y \quad (3)$$

As shown in graph 200 of FIG. 2 above, the synchronous component signal includes a generally sinusoidal waveform having an amplitude varying with the tilt angle θy. Solving equation (1) above provides an absolute value amplitude (|Im|) for a given set of samples of the quadrature signals 310, and the angle computation in equation (2) provides a corresponding rotor angle or phase angle value θim indicating the motor current angle with respect to the positive going zero crossing of the synchronous demodulator. With this information, the programmed processor 410 accesses a lookup table 416 including values corresponding to the tilt angle θy for a given absolute value amplitude |Im| and motor current angle θim or based on the absolute value amplitude |Im| and an absolute maximum current value |Imax| or this can be computed using equation (3) above in certain embodiments. Thus, the tilt angle θy can be determined at any point in time based on a set of two samples for the quadrature signals 310. In other embodiments, the processor is programmed to determine an average or peak amplitude value over a number of samples, preferably extending over multiple cycles of the synchronous component (e.g., over multiple revolutions of the rotor 120) and correlates the resulting amplitude value with a corresponding tilt angle θy using a corresponding parametric equation (3) or the LUT 416, without the need to compute the motor current angle θim. In this regard, the overall amplitude changes in the synchronous component 202 shown in FIG. 2 above for different tilt angles θy, and correlation of that amplitude change with a tilt angle change (graph 210) can be assessed through peak detection or other suitable techniques over one or more cycles of the synchronous (e.g., motor) frequency without requiring use of any phase angle information in order to estimate the tilt angle θy.

In addition, it is noted that operation of a DC motor at a generally constant speed w by constant DC voltage output from the power source 150 will generally result in a certain non-zero DC current flowing in the motor, with the synchronous component being added to such DC offset amount. A processor 410 obtaining multiple samples at a sample rate much higher than the synchronous frequency is programmed in certain embodiments to effectively remove the DC component and analyze the remaining synchronous (AC) component amplitude. In various embodiments, moreover, a high pass or bandpass filter 420 can be implemented with a cut-in frequency below the synchronous frequency in hardware as shown in FIG. 4 (and/or in processor-executed firmware or software) in order to remove low frequency components (e.g., including any generally constant DC offset in the motor current Im) prior to demodulation or other evaluation of the synchronous component. In other possible implementations, for example, the lookup table 416 (e.g., and/or the correlation curve in the graph 210 above) could be modified to incorporate any DC offset component thus allowing evaluation of the synchronous component amplitude of the motor current Im.

Figure 5:
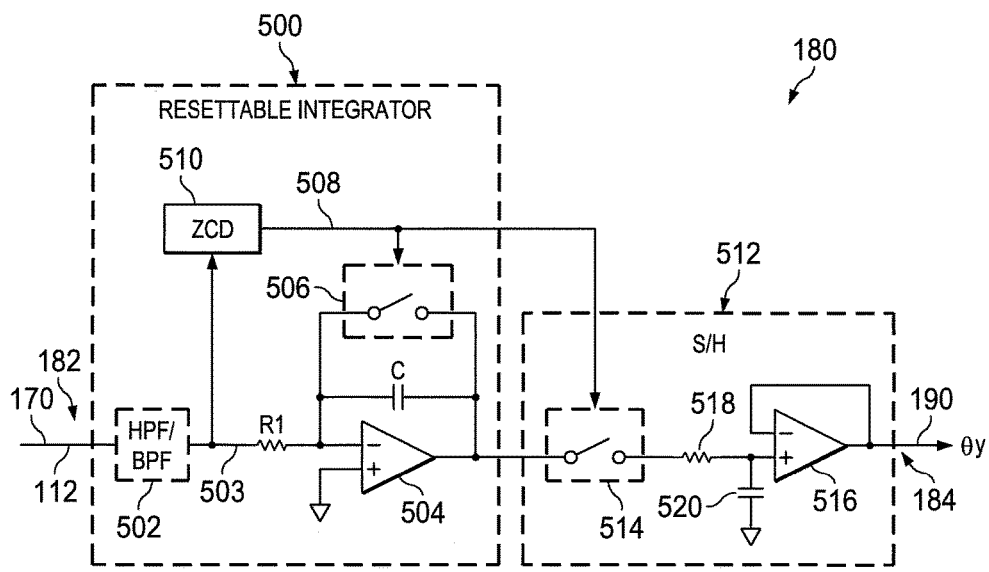
FIG. 5 is a schematic diagram of another tilt sensor apparatus embodiment including a resettable integrator circuit for providing a tilt angle output signal at least partially according to the synchronous component of the motor current.

FIG. 5 shows another tilt sensor apparatus embodiment where the detector circuit 180 includes a resettable integrator circuit 500 for providing a tilt angle output signal 190 at least partially according to the synchronous component of the motor current Im. In this implementation, no angle information is needed or used to estimate the tilt angle $\theta y$, with the integration provided by the circuitry 500 over one or more motor revolutions providing a signal based on the amplitude of the synchronous component. In one implementation, the integrator circuit 500 includes a high pass or bandpass filter 502 receiving the sensor output signal 170 and providing a filtered signal 503 to an op amp-based integrator circuit. In another embodiment, the filter circuit 502 is omitted, with the integrator circuit directly receiving the sensor output signal 170. As shown in FIG. 5, the high pass or bandpass filter 502 operates to remove low frequency components of the sensor output signal 170, and in the case of a bandpass filter, also removes high frequency components above the motor speed or frequency (above the frequency of the synchronous component of the motor current Im). The filter circuit 502 has an output coupled to provide a filtered signal to a resistor R1 of the integrator circuitry, which also includes an amplifier having an inverting input coupled with R1, and a feedback capacitor C coupled between the inverting input and the output of an op amp 504 which provides an amplifier output to a sample hold (S/H) circuit 512 including a switch 514, and op amp 516, and an RC low pass filter formed by a resistor 518 and a capacitor 520, with the op amp 516 providing the tilt angle output 190. The integrator embodiment 500 is resettable, and includes a first switch 506 operated according to a control signal 508 from a control circuit 510, such as a zero crossing detector (ZCD) circuit operable to provide a signal 508 to selectively close the switch 506 to discharge the integrator capacitor C in response to zero crossings of the sensor output signal 170. In one possible implementation, the zero crossing detector control circuit 510 selectively provides the signal 508 to close the switch 506 during a positive half cycle of the voltage at the output of the filter circuit 502 in order to integrate over a half cycle of the filtered sensor output signal 170. Other possible implementations provide for closing the switch 506 during negative half cycles, or predetermined portions of half cycles, or other variations are possible. In addition, the control circuit 510 in certain embodiments operates the sample hold switch 514 to selectively sample the output of the amplifier 504 prior to closure of the switch 506, based at least partially on zero crossings of the voltage of the integrator circuit input 170 (e.g., directly, or after the filter circuit 502). In this regard, a single control signal 508 can be used to operate switches 506 and 514, with one switch being normally open and the other normally closed. In other non-limiting examples, the control circuit 510 can provide separate switching control signals to operate the individual switches 506 and 514. In operation, the integration of the received signal (whether filtered or not) provides a voltage signal output 190 representing the amplitude of a synchronous component, and hence representing the tilt angle $\theta y$ by integration in the circuit 500 and subsequent sampling using the sample hold circuit 512.

Figure 6:
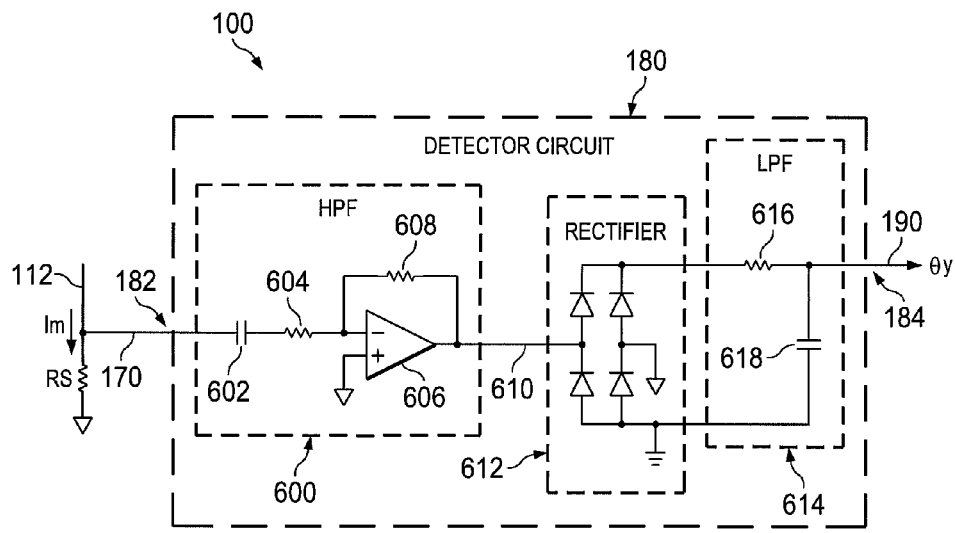
FIG. 6 is a schematic diagram of another tilt sensor apparatus embodiment including a high pass filter and a rectifier.

FIG. 6 depicts another tilt sensor apparatus embodiment where the detector circuit 180 includes a high pass filter circuit 600 for removing low frequency components of the sensor output signal 170, as well as a rectifier circuit 612 for rectifying the filtered signal. Other embodiments are possible in which a bandpass filter is used (not shown). The filter circuit 600 includes a DC blocking capacitance 602 with a first terminal coupled with the detector circuit input 182 to receive the sensor output signal 170, along with an amplifier 606 having an inverting (−) input coupled with the capacitance 602 through a resistor 604, as well as a non-inverting input connected to a ground node. A feedback resistor 608 is coupled between the inverting input and an output 610 of the amplifier 606, which provides a filtered signal to the rectifier circuit 612. The rectifier in the example embodiment includes a full bridge configuration of rectifier diodes and provides a rectified tilt angle output signal 190, in this case a voltage representing the tilt angle $\theta y$. In other embodiments a passive filter circuit 600 is used, which includes a single blocking capacitance, followed by an active or passive rectifier, such as a single rectifying diode. An output filter circuit 614 is provided in certain embodiments to stabilize the rectifier output, in one example including a resistor 616 and a capacitor 618 as shown in FIG. 6, with the output of the filter circuit 614 providing the tilt angle output signal 190 is a voltage signal representing the tilt angle $\theta y$.

Figure 7:
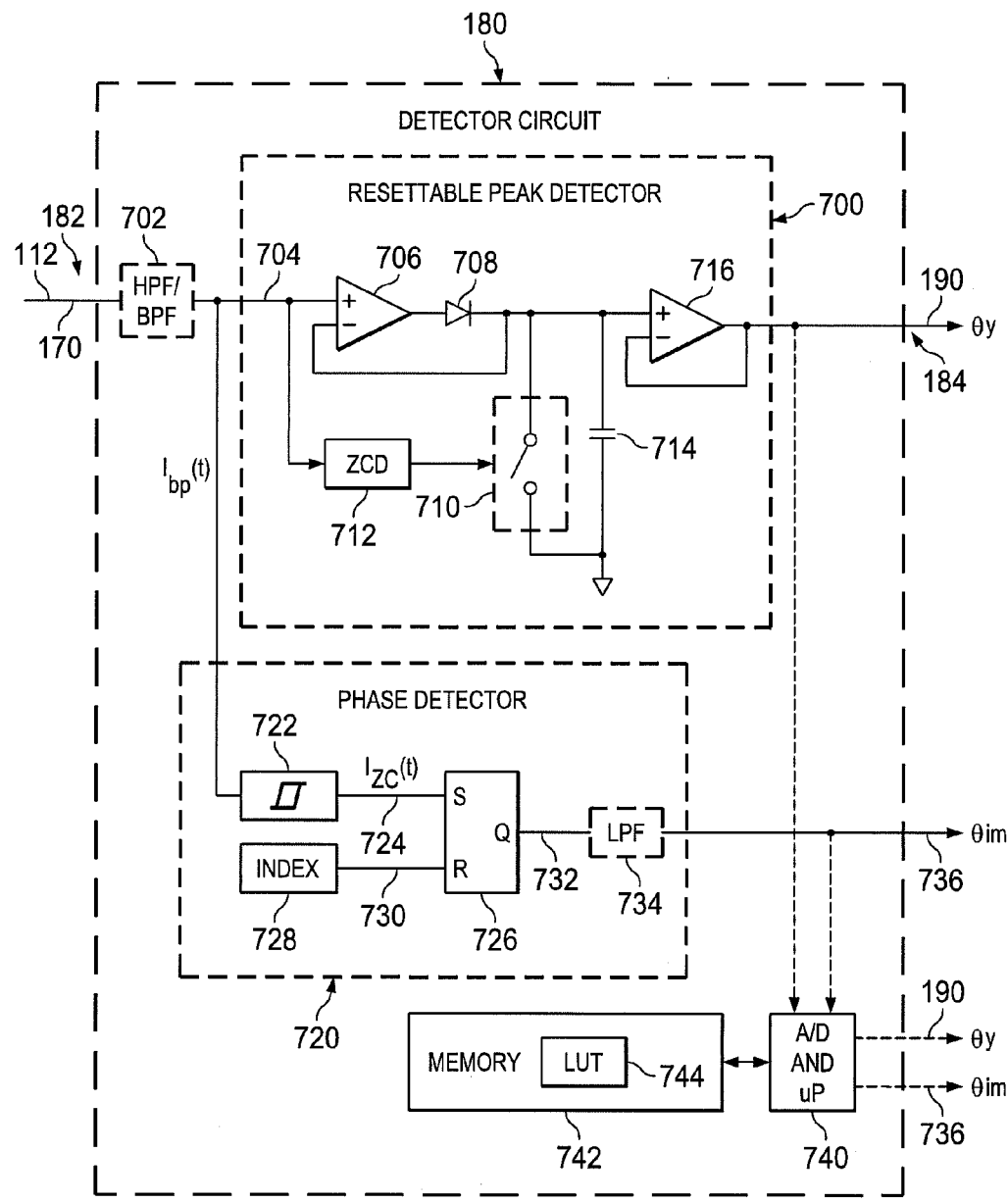
FIG. 7 is a schematic diagram of another tilt sensor apparatus embodiment including a resettable peak detector circuit for providing a tilt angle output signal and a phase detector circuit providing an output indicating the motor current angle.

FIG. 7 shows another tilt sensor apparatus embodiment including an active peak detector circuit for providing a tilt angle output signal 190 representing the tilt angle $\theta y$ between the rotor axis 140 and the gravitational axis G according to detected peaks of the sensor output signal 170. In addition, the example of FIG. 7 also includes a phase detector circuit 720 which provides an output signal 736 indicating the motor current angle $\theta im$. In certain embodiments, the phase detector circuit 720 is omitted, and the tilt angle signal 190 is employed by a host system as representing the tilt angle $\theta y$. This example also includes an input filter circuit 702, such as a high pass filter or bandpass filter, for removing low frequency components of the sensor output signal 170. In certain implementations, moreover, a processor circuit 740 is provided, which receives the signal 190 for conversion by an associated A/D converter, with the processor 740 indexing a lookup table 744 in an associated electronic memory 742 in order to determine a tilt angle value representing $\theta y$, which can be provided as a digital output 190. In various implementations, moreover, the processor 740 obtains and converts an analog voltage signal 736 from the phase detector circuit 720 representing the motor current angle $\theta im$, and uses the converted $\theta y$ and $\theta im$ values to index a lookup table 744 to obtain a tilt angle output value 190 which is provided as a digital value to a host system (not shown) by the processor 740. In other embodiments, and A/D converter circuit 740 provides the converted $\theta y$ and $\theta im$ digital values 190 and 736 to the host system for similar processing.

As shown in FIG. 7, the filter circuit 702 includes a filter input coupled with the detector circuit input 182 to receive the sensor output signal 170 and a filter output coupled to provide a filtered signal $I_{bp}(t)$ to an input 704 of the peak detector circuit 700 and also to any included phase detector circuit 720. The peak detector input 704 is coupled with (e.g., connected to) a non-inverting input of an op amp 706 configured as a follower, with an output diode 708 having an anode connected to the first amplifier output, and a cathode providing an output signal to a non-inverting input of a second follower amplifier 716 whose output provides the tilt angle output signal 190. A capacitance 714 is coupled between the non-inverting input of the amplifier 716 and a circuit ground, and a switch 710 is connected in parallel with the capacitance 714. A control circuit 720 operates to selectively reset the peak detector circuit 700 by closing the switch 710 to discharge the capacitance 714 in response to zero crossings of the sensor output signal 170. In this implementation, the control circuit 712 can be implemented using a zero crossing detection circuit operative to close the switch 710 to reset the voltage on the capacitor 714 and to remain closed only during positive half cycles of the voltage at the peak detector input node 704. As further shown in FIG. 7, the phase detector circuit example 720 includes a zero crossing detection circuit 722 with an output 724 coupled to provide a zero crossing detection signal $I_{zc}(t)$ with hysteresis to a set (S) input of a flip-flop 726. A reset (R) input of the flip-flop 726 is coupled with an output 730 from an index circuit 728, and a flip-flop output 732 (Q) is provided to an optional low pass filter 734 for providing the rotor angle (phase angle) output signal 736 representing the motor current angle θim.

Figure 8:
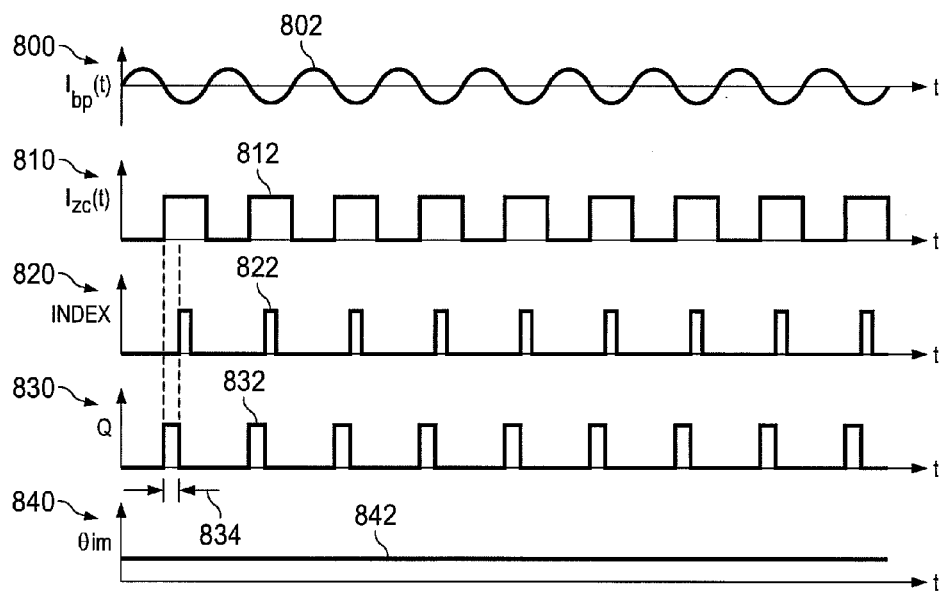
FIG. 8 is a graph of various signal waveforms in the detector circuit of FIG. 7.
Figure 9:
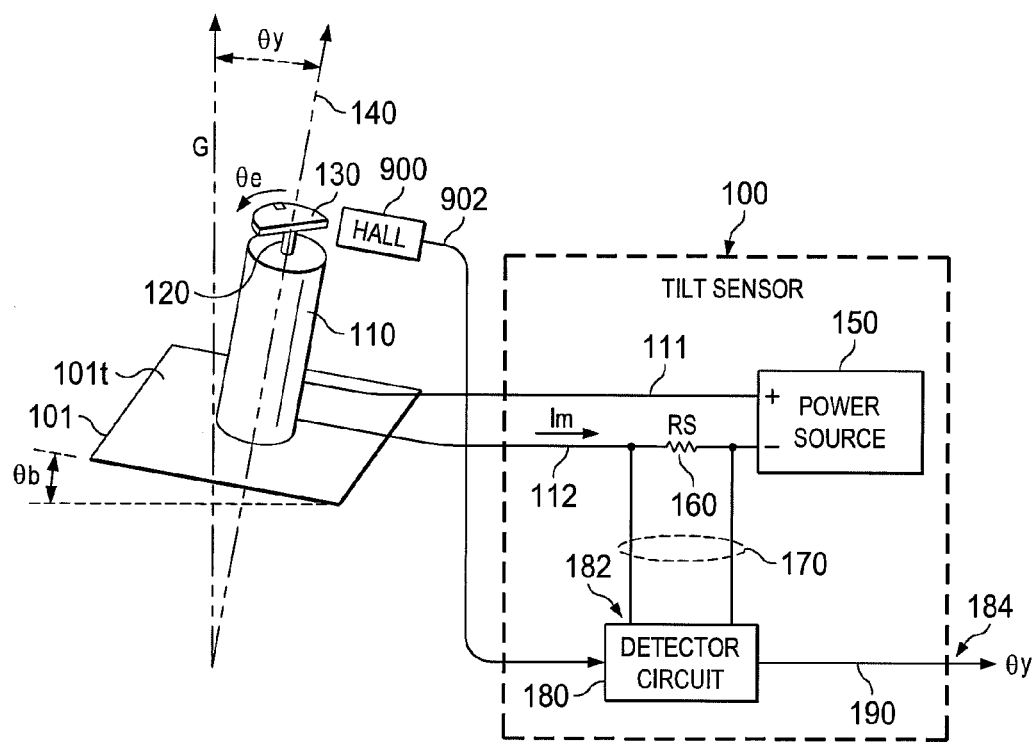
FIG. 9 is a system diagram of another tilt sensor apparatus embodiment including a hall sensor for detecting rotation of the eccentric mass.
Figure 10:
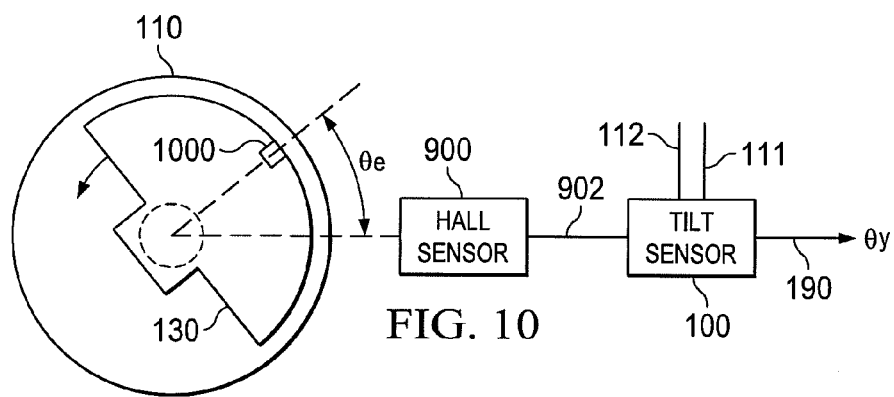
FIG. 10 is a top plan view showing rotation of the eccentric mass with the rotor in FIG. 9 as well as the location of the hall sensor for detecting the eccentric mass rotation.

In FIG. 8, graphs 800, 810, 820, 830 and 840 show various signal waveforms in the phase detector circuit 720 of FIG. 7. The graph 800 shows an example of a bandpass filtered signal waveform 802 ($I_{bp}(t)$), showing the synchronous component of the motor current Im with any DC offset removed by operation of the filter circuit 702. The graph 810 shows the zero crossing detector output waveform 812 ($I_{zc}(t)$) with alternating high and low-going pulse edges occurring in response to detected zero crossings of the filtered signal waveform 802. The index circuit output waveform 822 is shown in the graph 820, which in certain embodiments is synchronized with the synchronous component of the motor current Im to provide a pulse as shown during each synchronous cycle when the rotor 120 passes a reference position (e.g., when a permanent magnet 1000 associated with the eccentric mass 130 passes a sensor 900 as shown in FIGS. 9 and 10 below), and the flip-flop output waveform 832 in the graph 830 has a pulse width 834 generally corresponding to the time between the high going pulse edges of the zero crossing detector output waveform 812 and the leading edge of the corresponding index pulse waveform 822. Low pass filtering the Q output from the flip-flop circuit 726 provides a phase angle signal waveform 842 with an amplitude generally corresponding to the width 834 of the flip-flop output pulses 832. The phase detector circuit 720 provides an analog voltage proportional to the phase of the filtered signal with respect to the index signal 822. In other possible embodiments, the processor circuit 740 can directly receive the flip-flop output 732 in order to measure the duty cycle or pulse width 834 of the flip-flop output waveform pulses 832 to compute a phase angle value θim and provide this is a digital output 736.

FIG. 9 shows another example system with a tilt sensor apparatus embodiment 100 including a hall sensor 900 for detecting rotation of the eccentric mass 130, and FIG. 10 shows rotation of the eccentric mass 130 with the rotor in FIG. 9, along with the hall sensor 900 for detecting passage of a permanent magnet 100 of the eccentric mass 130. As shown in FIGS. 9 and 10, the Hall sensor 900 is coupled via one or more wires or circuit board traces 902 in order to provide a sensor signal to the detector circuit 180 of the tilt sensor apparatus 100 based on detection of the proximity of the permanent magnet 1000. Alternate implementations are possible, for example, with a pickup coil sensing or otherwise detecting the presence or absence of the magnet 1000. Also, an inductive sensor can be used to detect rotation of the eccentric mass 130 in other embodiments.

Figure 11:
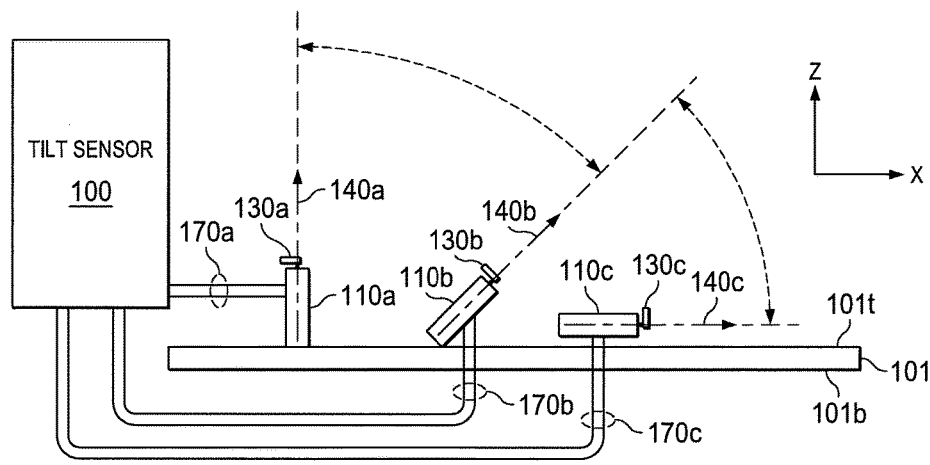
FIG. 11 is a simplified side elevation view of a system having multiple eccentric mass motors with rotor axes positioned at different angles relative to a plane of a base and a tilt sensor apparatus for sensing a tilt angle of the base relative to a gravitational axis at least partially according to synchronous components of the motor currents.
Figure 12:
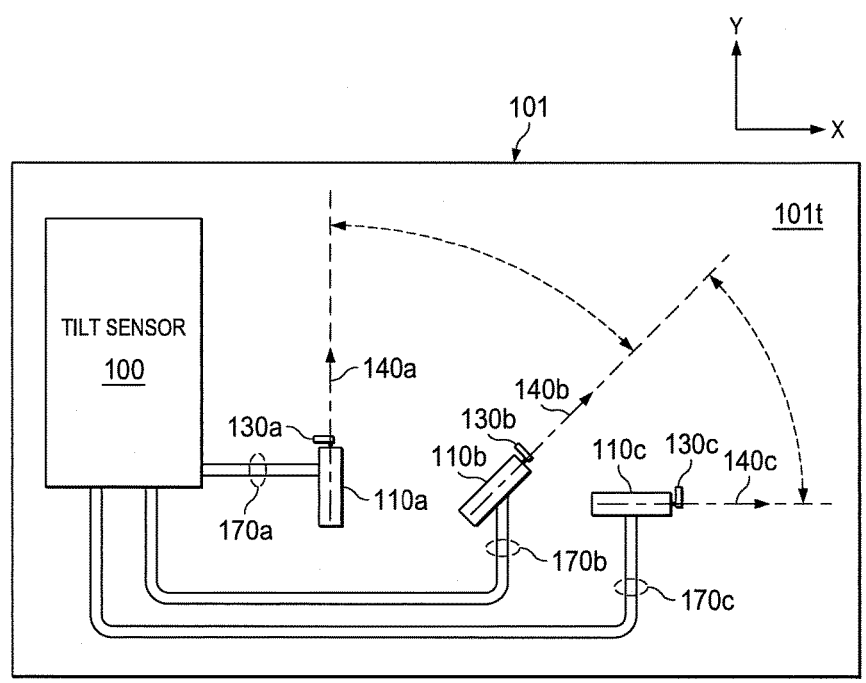
FIG. 12 is a simplified top plan view of another system embodiment having multiple eccentric mass vibratory motors with rotor axes positioned at different angles relative to one another in parallel with a plane of the base.
Figure 13:
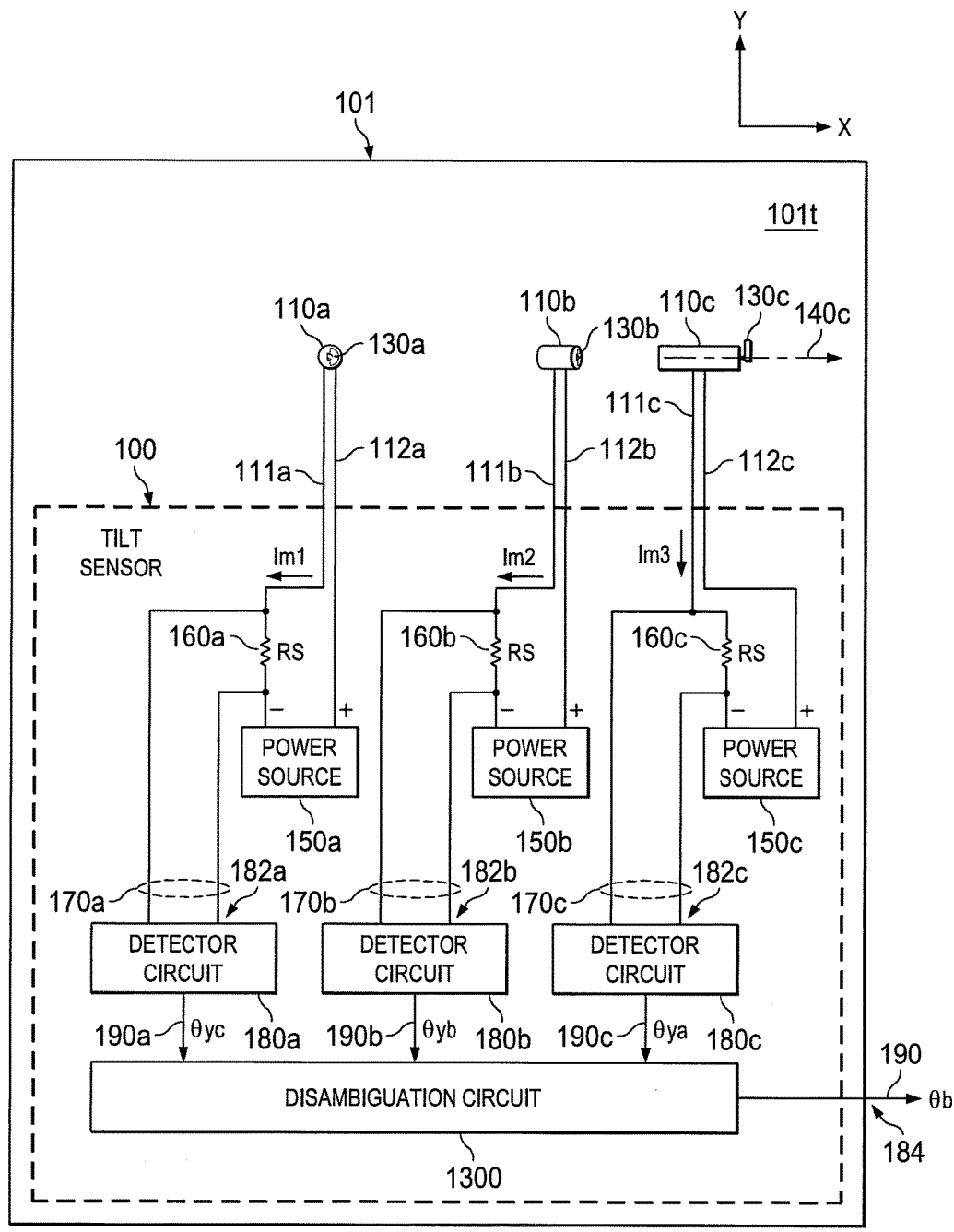
FIG. 13 is a simplified top plan view of another multiple motor system with eccentric mass vibratory motors with rotor axes positioned at different angles relative to the plane of the base and at non-zero angles relative to one another as in FIG. 11, along with a tilt sensor apparatus embodiment for providing an output signal representing a tilt angle of the base at least partially according to synchronous components of the motor currents.

Referring now to FIGS. 11-13, FIG. 11 shows another tilt sensor system including a tilt sensor apparatus 100 as previously described, in which three eccentric mass motors 110a, 110b and 110c are disposed with corresponding rotor axes 140a, 140b and 140c at predetermined or fixed angles relative to a plane of the top or upper surface 101t of a base 101 having a top side or surface 101t and a bottom side or surface 101b. Each of the motors 110 in this example includes a corresponding rotor with eccentric masses 130a, 130b and 130c and the motor leads are connected to corresponding sensors in the tilt sensor apparatus 100 to provide corresponding sensor output signals 170a, 170b and 170c representing the corresponding motor currents Im1, Im2 and Im3. The rotor axes 140a, 140b and 140c are disposed at non-zero angles with respect to one another. In this case, the rotor axes 140 are progressively offset by 45° from one another, with the third rotor axis 140c being essentially parallel to the plane of the base 101, the rotor axis 140b offset by 45°, and the first rotor axis 140a being generally normal to the plane of the top surface 101t of the base 101.

FIG. 12 shows another system embodiment having multiple eccentric mass motors 110 with rotor axes 140 positioned at different angles relative to one another in parallel with the plane of the base 101. Other system embodiments are contemplated, for example, in which the configurations of FIGS. 11 and 12 are combined, with the system providing multiple motors 110 for detecting unambiguous angular positions of the base 101 in three space relative to a gravitational axis. In this manner, the system is particularly advantageous for robotics or other machine control or motion control applications, as well as for game controller applications, radio controlled vehicle applications, aeronautic applications, navigation systems, etc.

Figure 14:
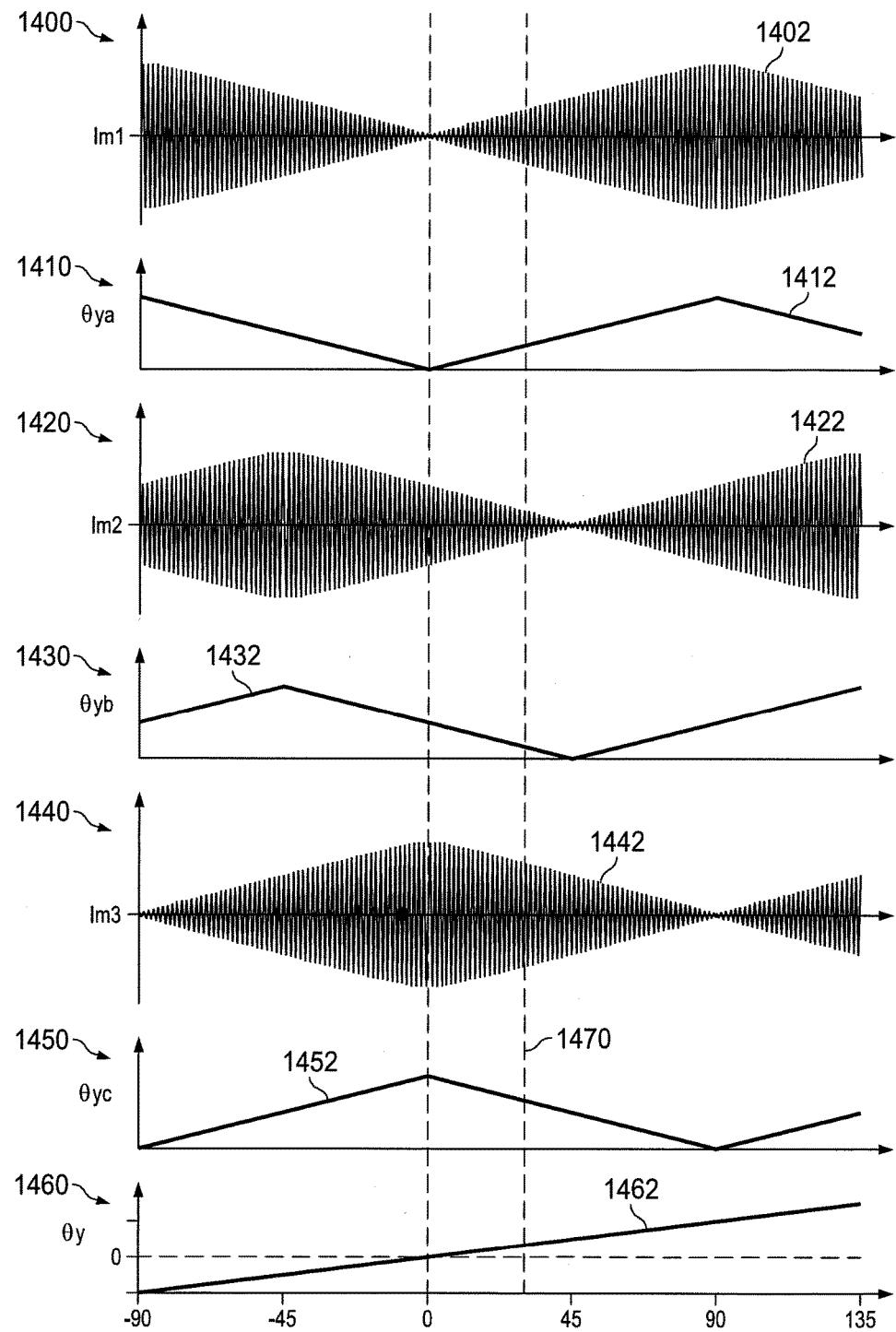
FIG. 14 is a graph of synchronous motor current component curves and corresponding tilt angle signals for the individual eccentric mass vibratory motors in the system of FIG. 13 as well as a curve showing the tilt sensor output signal.
Figure 15:
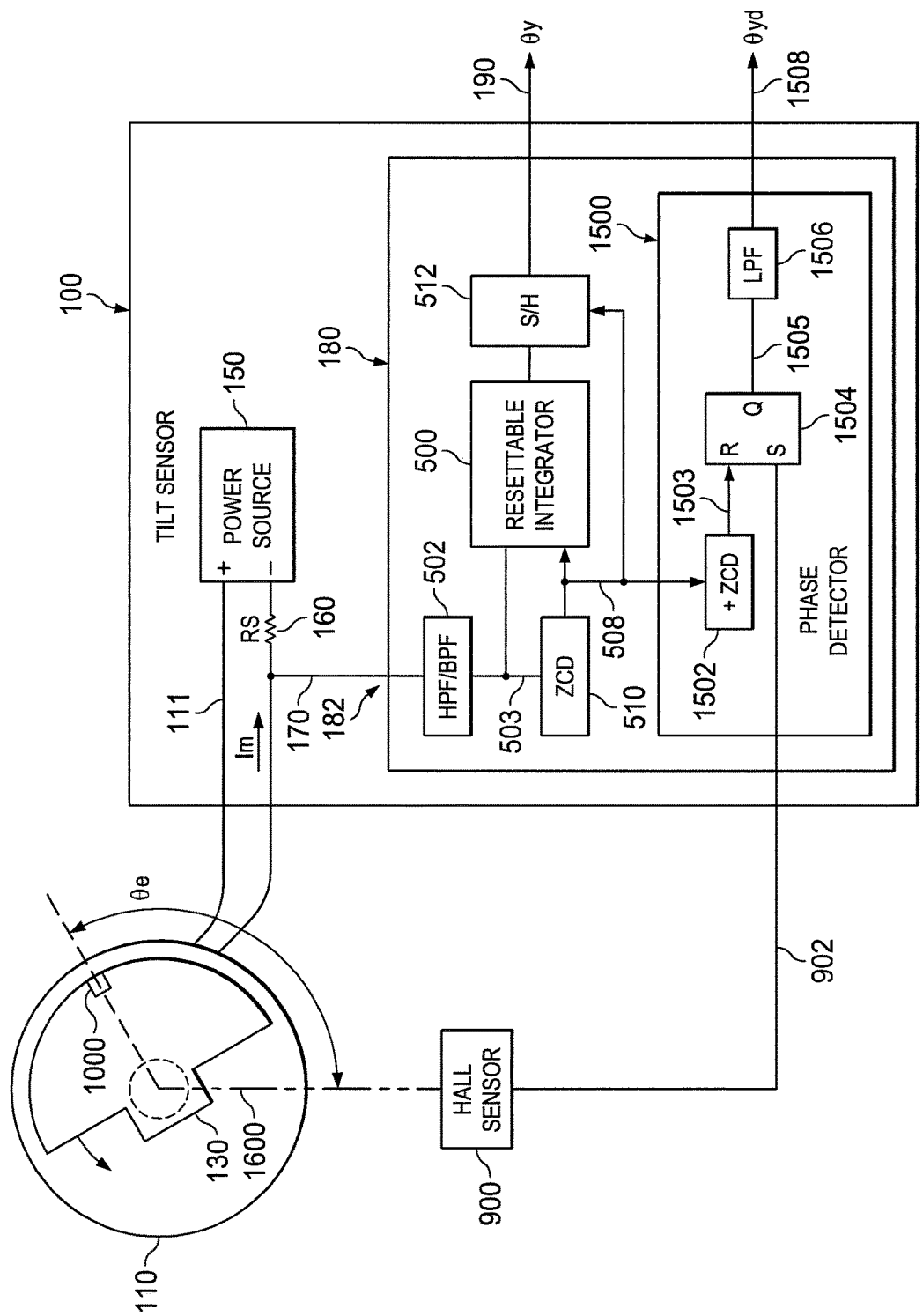
FIG. 15 is a schematic diagram of another tilt sensor apparatus embodiment with a phase detector circuit providing a tilt direction output based at least partially on the synchronous component of the motor current and a Hall sensor signal.

FIG. 13 shows another possible configuration in a system including three eccentric mass motors 110a, 110b and 110c with rotor axes positioned at different angles relative to the plane of the base 101, and progressively angularly spaced from one another in 45° increments as also shown in FIG. 11. In FIG. 14, graphs 1400, 1410, 1420, 1430, 1440, 1450 and 1460 show synchronous motor current component curves 1402, 1422 and 1442 as well as corresponding tilt angle signal waveforms 1410, 1430 in 1450 for the individual eccentric mass vibratory motors 110a, 110b and 110c, respectively. In addition, the graph 1460 in FIG. 14 shows the output signal waveform 1462 representing a tilt angle θy (FIG. 1) of the apparatus relative to the gravitational angle G. As noted in FIG. 1, the angular offset θy between the gravitational axis G and the rotor axis 140 that is normal to the plane of the base 101 correlates to the base tilt angle θb representing an angular deviation between the plane of the base 101 and a horizontal plane, and the tilt sensor apparatus 100 can be used to assess a tilt angle θb of the base structure 101 in relation to the gravitational axis G or to a horizontal plane normal to the gravitational axis.

As shown in FIGS. 13 and 14, moreover, multiple eccentric mass motors 110 can be employed using the above described techniques and circuitry in order to provide an estimated tilt angle for a given structural base 101 over a large angular range. In this regard, the offsetting of the motors 110 in FIG. 13 by 45° allows disambiguation using a disambiguation circuit 1300 (FIG. 13) to extend the angle detection or estimation range beyond 90°. As shown in the graphs 1400, 1420 and 1440, the synchronous component of the motor current provides an enveloped sinusoidal waveform which repeats every 90° of angular rotation for tilt, with the techniques of FIGS. 11-13 providing staggered offsetting of multiple eccentric mass motors 110 by a value less than 90° (in this case 45°). FIG. 14 shows an example for a device having a base 101 typically used with the base plane strictly horizontal, such that the "Y" axis shown in FIG. 13 is by default normal to the gravitational axis G, denoted by the dashed vertical line at 0° on the horizontal scale in FIG. 14.

In one example, positioning of the base 101 at an effective angle θy of +30° relative to the gravitational axis is shown as dashed line 1470 in FIG. 14 (e.g., by rotation of the base in FIG. 13 clock wise about the "Y" axis in FIG. 13 by 30°), and the tilt angle output signal waveform 1412 for the first eccentric mass motor 110a is at a level or amplitude corresponding to +30° or −30°. Accordingly, provision of a single eccentric mass motor 110a positioned as shown in FIG. 13 provides ambiguous information about whether the base 101 has been rotated clockwise or counterclockwise about the Y axis by that amount. As shown in the graph 1430 of FIG. 14, however, the tilt angle output signal waveform 1432 for the second eccentric mass motor 110b has two distinct amplitudes or levels for +30° and −30°. The tilt sensor apparatus 100 in FIG. 13 includes disambiguation circuitry 1300 to provide a single tilt angle output signal or value representing an angle θb of the plane of the base 101 relative to a gravitational axis G or relative to a horizontal plane. Moreover, the use of multiple angularly-offset sensors (e.g., eccentric mass motors or actuators) in two or more non-parallel planes, together with the disambiguation circuit 1300 allows identification of both the tilt angle value θy relative to the gravitational axis G in FIG. 1 (and/or the angle θb of the structural base 101 relative to the gravitational axis G), as well as a rotational angle or tilt direction angle θyd representing the angle of the motor axis 140 relative to a horizontal reference, such as true North N as shown in FIG. 1 above.

The circuit 1300 in FIG. 13 is operatively coupled with the detector circuits 180a, 180b and 180c to receive the tilt angle output signals or values 190a, 190b and 190c and is operative to provide a tilt angle output signal or value 190 representing a base tilt angle θb of the plane of the base 101 relative to the gravitational axis (e.g., G) based at least partially on the tilt angle output signals or values 190a, 190b and 190c. Continuing with the above example, the circuit 1300 in one embodiment includes comparison circuitry, analog and/or digital, for comparing the various tilt angle output signal waveforms 1412, 1432 and 1452 to identify matching information regarding the true base tilt angle θb. In the above scenario, for instance, the disambiguation circuit 1300 is operable to recognize the two possible angle values +30° and −30° corresponding to the signal waveform 1412 from the first detector circuit 180a, and also recognize the two possible angle values +30° and +75° corresponding to the signal waveform 1432 from the second detector circuit 180b. In this case, the disambiguation circuit 1300 provides the output signal or value 190 representing the base tilt angle θb corresponding to the matching value (e.g., +30°) indicated by the first and second waveforms 1412 and 1432. As shown in FIG. 14, moreover, provision of the third eccentric mass motor 110c extends the unambiguous angular range even further, and various embodiments are contemplated in which multiple angularly offset eccentric mass motors 110 are provided for unambiguous angular measurement of the tilt angle θb relative to a gravitational axis, where such groupings of offset eccentric mass motors 110 can be provided in two generally orthogonal planes (e.g. parallel to the plane of the base 101, and normal to the plane of the base 101 in one non-limiting example) to provide unambiguous tilt angle detection or estimation in three space.

Referring now to FIGS. 15-21, FIG. 15 shows another tilt sensor apparatus embodiment 100 including a phase detector circuit 1500 in the detector circuit 180 for providing a tilt direction angle signal or value 1508 (θyd) relative to an axis 1600 extending from the sensing face of the Hall sensor 900 for the center of the rotor axis, in addition to the tilt angle signal or value 190 (θy) relative to the gravitational axis G. In this example, the detector circuit 180 includes a high pass filter/bandpass filter circuit 502, a zero crossing detector circuit 510, a resettable integrator circuit 500 and a sample and hold circuit 512 providing the tilt angle signal or value 190 generally as described above in connection with FIG. 5. In addition, a phase detector circuit 1500 includes a positive zero crossing detection circuit 1502 receiving the output 508 from the zero crossing detector circuit 510 and providing a reset ("R") input signal 1503 to an RS flip-flop 1504. The "set" ("S") input to the flip-flop 1504 is provided with the output signal 902 from the Hall sensor 900, with the flip-flop 1504 "Q" output 1505 providing an input to a low pass filter circuit 1506. The output of the low pass filter thus represents the phase difference between the positive zero crossings of the synchronous component of the motor current Im and passing of the magnet 1000 pass the sensing face of the Hall sensor 900 as the eccentric mass 130 rotates about the rotor axis 140.

The inventor has appreciated that the Hall sensor signal 900 to provides a high going pulse edge when the eccentric mass magnet 1000 becomes proximate with the sensor 900, and that a pulse provided by the sensor 900 will have a width representing the time during which the magnet 1000 is within the sensing range of the sensor 900. As such, the leading (high-going in one example) edge of the Hall sensor output signal pulse indicates that the eccentric mass 130 is aligned with the axis 1600 extending from the sensing face of the Hall sensor 900 toward the rotor 120. Relative to this reference direction 1600, the apparatus 100 can identify a tilt direction signal or value θyd 1508. In this regard, if the rotor axis 140 is parallel with the gravitational axis G, the tilt angle θy is 0° as described above, as there is essentially zero synchronous component of the motor current Im.

Figure 16:
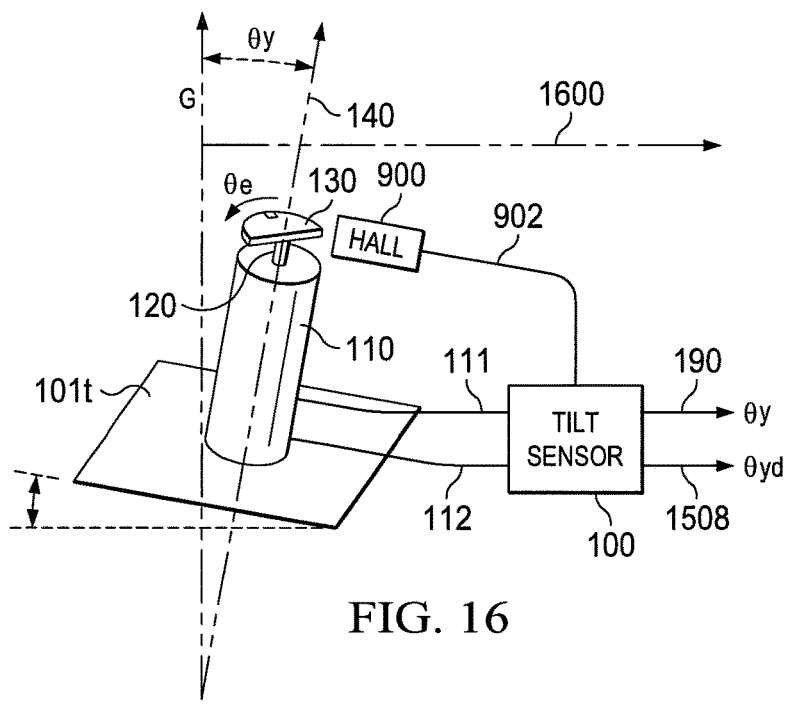
FIG. 16 is a system diagram of one possible orientation of the sensor apparatus relative to a gravitational axis, with a tilt direction at a 0° tilt direction relative to an axis from the Hall sensor face to the rotor axis.
Figure 17:
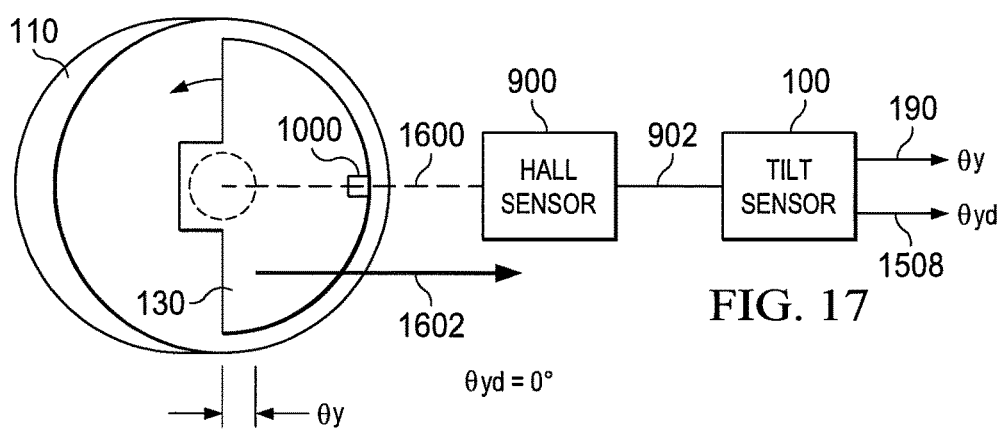
FIG. 17 is a simplified top plan view of the apparatus oriented as in FIG. 16.
Figure 18:
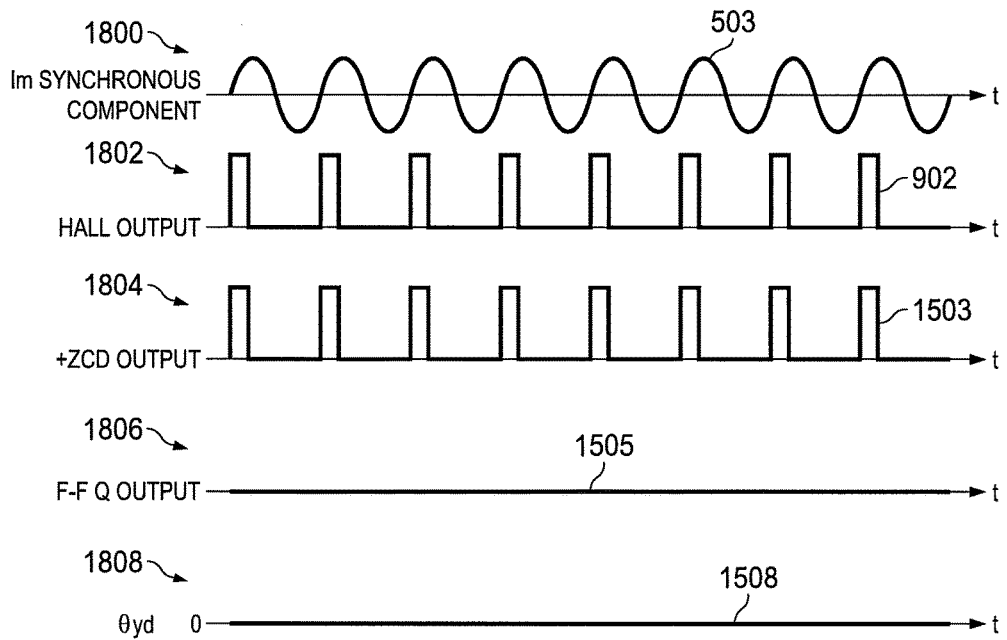
FIG. 18 is a graph showing signal waveforms in the tilt sensor apparatus of FIG. 15 for determining the tilt direction signal or value with the apparatus oriented as shown in FIGS. 16 and 17.

Referring also to FIGS. 16-18, however, the motor 110 in one example orientation is tilted in a direction 1602 toward the sensor in a direction essentially parallel with the axis 1600 as shown in FIGS. 16 and 17 (the gravitational axis G lies along the axis 1600), where FIG. 17 shows a top view of the apparatus oriented as in FIG. 16 at a 0° tilt direction θyd 1508 relative to the axis 1600 from the Hall sensor face to the axis 140 of the rotor 120. The graphs 1800, 1802, 1804, 1806 and 1808 of FIG. 18 show signal waveforms 503, 902, 1503, 1505 and 1508, respectively in the tilt sensor apparatus of FIG. 15 for determining the tilt direction signal or value with the apparatus oriented as shown in FIGS. 16 and 17. In the orientation of these FIGS. 16 and 17, the synchronous component of the motor current Im (waveform 503 in the graph 1800 of FIG. 18) is increasing through zero when the rising edge of the Hall sensor signal 902 is generated (waveform 902 in the graph 1802). At this point, the eccentric mass 130 is at its lowest vertical position and is increasing. In addition, the positive zero crossing detection circuit 1510 (FIG. 15) provides the rising edge of the flip-flop reset signal (waveform 1503 in graph 1804 of FIG. 18) in alignment with the rising edge of the Hall sensor output signal 902 (graph 1802), and thus the flip-flop output (waveform 1505 in graph 1806) remains low, and the low pass filtered signal output waveform 1508 (θyd in graph 1808) is zero, thus indicating the tilt direction at 0° relative to the sensor-rotor axis 1600. In this manner, the tilt sensor 100 of FIG. 15 identifies both the tilt angle signal or value 190 (θy) relative to the gravitational axis G and the tilt direction angle signal or value 1508 (θyd) relative to the sensor face-rotor axis or direction 1600. Thus, the apparatus 100 can be employed to provide a polar coordinate indication of the amount of tilt from the gravitational axis G (e.g., θy representing the vector magnitude) and the angular tilt direction relative to a fixed direction (e.g., θyd representing the vector angle when viewed from above).

Figure 19:
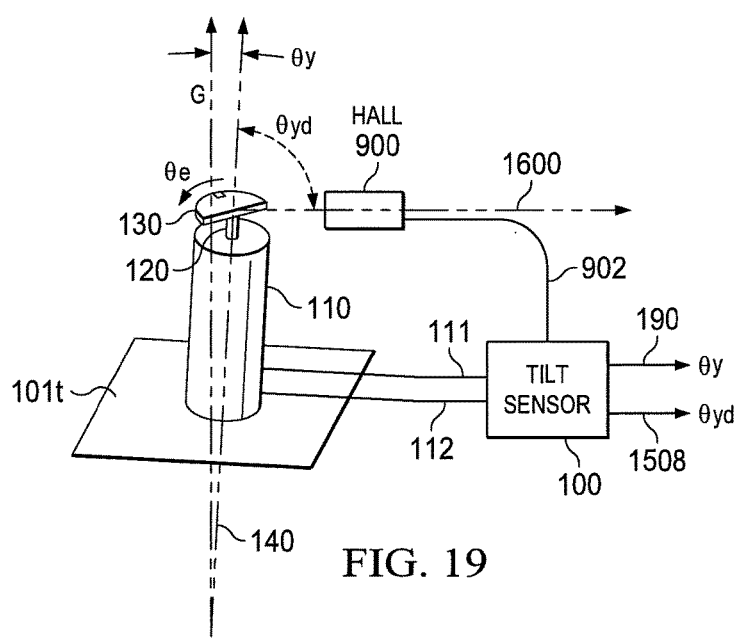
FIG. 19 is a system diagram of another possible orientation of the sensor apparatus with a tilt direction at a 70° tilt direction relative to the axis from the Hall sensor face to the rotor axis.
Figure 20:
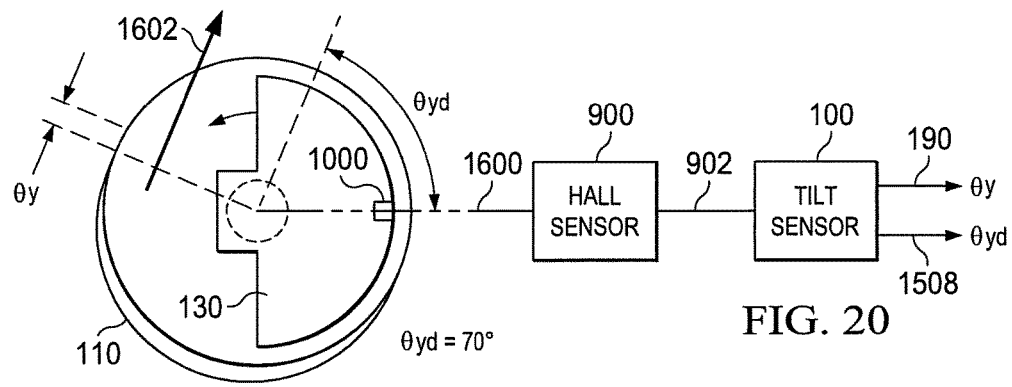
FIG. 20 is a simplified top plan view of the apparatus oriented as shown in FIG. 19.
Figure 21:
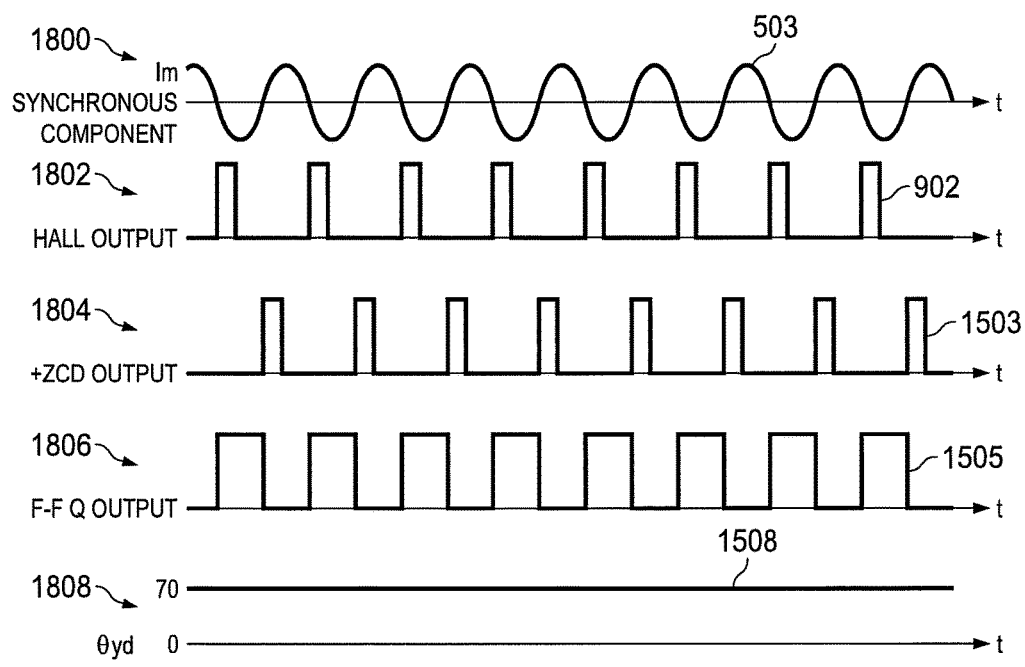
FIG. 21 is a graph showing signal waveforms in the tilt sensor apparatus of FIG. 15 oriented as shown in FIGS. 19 and 20.

Referring also to FIGS. 19-21, the system diagram of FIG. 19 and the top view of FIG. 20 show the apparatus in another possible orientation 1602 at a 70° tilt direction θyd relative to the axis 1600 from the Hall sensor face to the rotor axis 140. In addition, the graphs 1800-1808 show the corresponding signal waveforms 503, 902, 1503, 1505 and 1508 for this position of the apparatus. In this case, the point where the motor torque rises through the nominal value (rising zero crossings in the motor current synchronous component curve 503 in FIG. 21) triggers rising edge is in the pulse waveform 1503 in the graph 1804 a relative phase angle of 70° following the rising edges of the sensor output signal waveform 902 in graph 1802. Accordingly, the set and reset signals provided to the flip-flop 1504 (FIG. 15) are offset in time, and the Q output signal waveform 1505 in graph 1806 provides a pulse with a non-zero duration as shown in FIG. 21. Low pass filtering of the pulse signal 1505 via the low pass filter circuit 1506 (FIG. 15) provides a non-zero output signal waveform 1508 in graph 1808 representing the 70° tilt direction θyd corresponding to the tilt direction of the apparatus with respect to the axial direction 1600 between the sensing phase of the Hall sensor 900 and the axis 140 of the rotor 120. Thus, the sensor apparatus advantageously provides an indication the amount of tilt θy as well as the tilt direction θyd.

Modifications are possible in the described embodiments, and other embodiments are possible, within the scope of the claims.

What is claimed is:

1. A tilt sensor apparatus, comprising:
a sensor having a sensor input adapted to be coupled to a DC brushed motor power lead and having a sensor output, to provide a sensor output signal representing a motor current flowing in a motor having a rotor supporting an eccentric mass as the rotor is rotated about a rotor axis; and
a tilt angle detector circuit including:
a synchronous demodulator having an input coupled to the sensor output and having quadrature outputs providing quadrature output signals representing an amplitude and a phase of a synchronous component of the motor current; and
an output circuit coupled to the quadrature outputs and having a tilt angle output providing a tilt angle output signal or value, in which the output circuit includes processor circuitry to compute a motor current angle value according to the quadrature signals, and the tilt angle output signal or value is based at least partially on the computed motor current angle value.

2. The tilt sensor apparatus of claim 1, in which the tilt angle detector circuit includes a phase locked loop (PLL) to determine a frequency of the synchronous component of the motor current, the PLL having an input to receive the sensor output signal and an output to provide a signal or value, representing the frequency of the synchronous component of the motor current, to the synchronous demodulator.

3. The tilt sensor apparatus of claim 1, in which the tilt angle detector circuit includes a filter circuit to remove low frequency components of the sensor output signal, the filter circuit including: at least one input to receive the sensor output signal; and an output to provide a filtered sensor output signal to the synchronous demodulator.

4. The tilt sensor apparatus of claim 1 in which the synchronous demodulator includes:
a first multiplier having an input coupled to the sensor output signal, an input receiving a SINωt signal, and an output coupled to one of the quadrature output signals; and
a second multiplier having an input coupled to the sensor output signal, an input receiving a COSωt signal, and an output coupled to the other one of the quadrature output signals.

5. The tilt sensor apparatus of claim 1 in which the synchronous demodulator includes:
a first multiplier having an input coupled to the sensor output signal, an input receiving a SINωt signal, and an output;
a first amplifier having an input coupled to the output of the first multiplier and an output coupled to one of the quadrature output signals;
a second multiplier having an input coupled to the sensor output signal, an input receiving a COωt signal, and an output coupled to the other one of the quadrature output signals; and
a second amplifier having an input coupled to the output of the second multiplier and an output coupled to the other one of the quadrature output signals.

6. The tilt sensor apparatus of claim 1 in which the output circuit includes:
analog to digital converter circuitry having inputs coupled to the quadrature output signals and having digital outputs;
memory including a look up table; and
processor circuitry coupled to the digital outputs and the memory to provide the tilt angle output signal or value.

* * * * *